Dec. 19, 1961 M. H. BROGDEN 3,014,160

PLUG-IN CHASSIS ASSEMBLY

Filed Oct. 1, 1958

INVENTOR
MORRIS H. BROGDEN

BY Harrington A. Lackey
ATTORNEY

United States Patent Office

3,014,160

Patented Dec. 19, 1961

3,014,160

PLUG-IN CHASSIS ASSEMBLY

Morris H. Brogden, Nashville, Tenn.
(R.R. 1, Hermitage, Tenn.)

Filed Oct. 1, 1958, Ser. No. 764,678
3 Claims. (Cl. 317—101)

This invention relates to a chassis for supporting electronic components, and more particularly to a chassis of a plug-in design slideably mounted within a tray assembly for supporting and electrically connecting electronic components.

One object of this invention is to provide a plug-in chassis for supporting electronic components slideably mounted within a tray assembly in which the chassis may be partially removed from the tray assembly without breaking the electrical connection.

Another object of this invention is to provide a plug-in chassis for supporting electronic components which is adapted to slide into and out of a tray assembly having a panel face, electrical connection of the chassis-mounted electronic components to a power source being established when the chassis is moved entirely into the tray assembly, but electrical disconnection being established only after the chassis has been withdrawn a predetermined distance out of the tray assembly.

Another object of this invention is to provide a plug-in chassis for slideably supporting electronic components within a tray assembly which facilitates maintenance.

A further object of this invention is to provide a plug-in chassis for supporting electronic components within a tray assembly which is of a simple, inexpensive and modular construction.

Another object of this invention is to provide a plug-in chassis for slideably mounting electronic components within a tray assembly having a panel face in which all of the trimming and control devices for the electronic components are concealed when the chassis is fully inserted into the tray assembly.

A further object of this invention is to provide a plug-in chassis for slideably mounting electronic components within a tray assembly in which all of the trimming and control devices for the electronic components are completely concealed when the chassis is fully inserted into the tray assembly but will become accessible to the operator without breaking the electrical connection of the electronic components, when the chassis is partially withdrawn.

Another object of this invention is to provide a plug-in chassis for mounting electronic components within a tray assembly having a front panel face where the rear end of the chassis is provided with an electrical connector which is adapted to be received in a mating connector carried by a slide bracket adapted for limited slideable movement in the rear of the tray assembly and which is in turn connected by a flexible connection to a power source.

Another object of this invention is to provide a plug-in chassis for slideably mounting electronic components within a tray assembly which is adapted for either multiple-rack or individual mounting.

Further objects and advantages of the invention will be apparent from the following description, taken in conjunction with the drawings, wherein.

Figures 1, 2, 3:
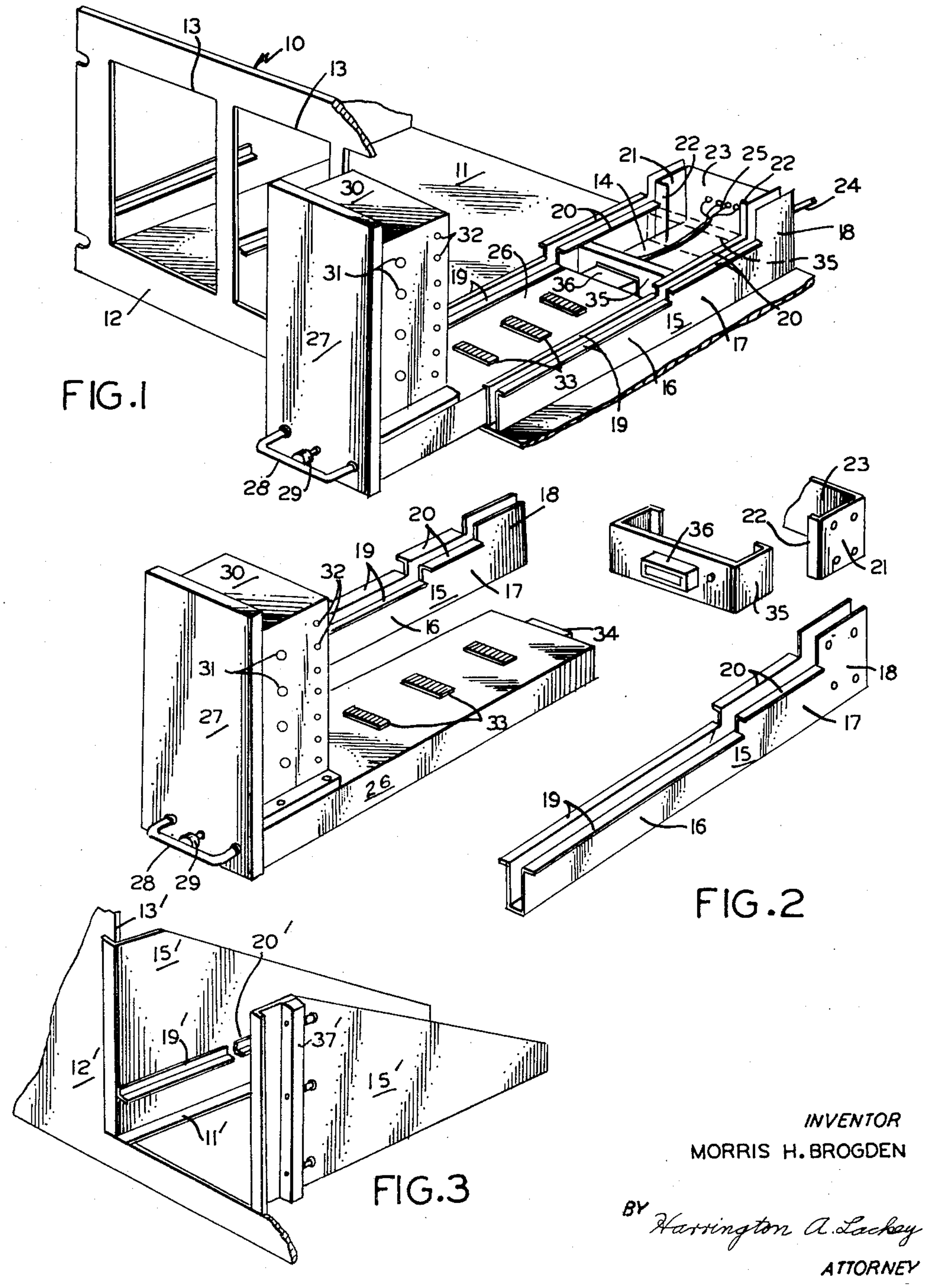
FIG. 1 is a perspective view, with parts broken away, disclosing the invention with the chassis partially withdrawn from the tray assembly and electrically connected to the slide bracket.
FIG. 2 is an exploded assembly view of the invention disclosed in FIG. 1.
FIG. 3 is a perspective view of the tray assembly adapted for individual mounting.

Referring now to the drawings in more detail, FIG. 1 discloses a multiple tray assembly 10 having a bottom 11 and a front panel 12 provided with rectangular frame openings 13. Each opening 13 provides an entrance to a tray or compartment 14 defined by the bottom 11 and a pair of parallel side guide walls 15.

As best disclosed in FIGS. 1 and 2, each side guide wall 15 is graduated into three sections, 16, 17 and 18, of different heights. The front wall section 16 is of the lowest height and has top flanges 19 turned in at substantially right angles to the wall section 16. The front wall section 16 is also considerably longer than either the middle or rear sections 17 and 18. The middle wall section 17 is slightly higher than the front wall section 16 and also has an inturned top flange 20 at substantially a right angle to the wall section 17. The rear wall section 18 is of the greatest height, and is preferably of shorter length than either the front or middle wall sections. A terminal strip bracket 21 of substantial U-shape, the sides of which have inturned end flanges forming rear stops 22, for a purpose later to be described, is fixedly mounted between the rear wall sections 18. The rear wall 23 of the terminal strip bracket 21 comprises the rear wall of each tray 14, and is adapted to support a cable 24 or other permanent wiring from an electrical power source, not shown. A plurality of loop flexible electrical wires 25 are connected to the cable 24 and extend toward the front of the tray 14.

Adapted to be slideably received in the frame opening 13 and between the side guide walls 15 is a chassis 26. Mounted on the front of the chassis 26 is the front face 27 of similar shape but slightly larger than the frame opening 13 to limit the rearward movement of the chassis 26. A handle 28 is fixed to the front face 27 to maneuver the chassis 26 in and out of the tray assembly 10. A locking device 29 of any conventional type is also provided on the front face 27 in order to quickly lock and unlock the chassis in place within the tray assembly 10.

Mounted near the front of the chassis 26 and immediately behind the front face 27 is a shield 30 which serves as a dead-front wiring chassis provided with apertures 31 and 32, through which may be mounted trimming-adjustments, test jacks, and any other desired control devices such as switches, fuses, potentiometers and meters. The top of the remaining portion of the chassis 26 may be provided with electrical receptacles 33 for receiving the electronic components, not shown. An electrical connector of a convenient type, such as a plug 34, extends from the rear face of the chassis 26 and is electrically connected to the receptacles 33 upon which electronic components may be mounted. The height of the chassis 26 is such that the top flanges 19 will slideably engage the top of the chassis 26.

A slide bracket or connector support member 35, substantially the same height as the middle wall section 17 and higher than the front wall section 16, is adapted to slideably engage the middle wall sections 17 and the inturned top flanges 20. The slide bracket 35 carries an electrical connector such as a receptacle or socket 36 adapted to mate with the plug 34. The socket 36 is electrically connected to the loop flexible wires 25 in such a manner that when the plug 34 engages the socket 36, a complete circuit is established between the power source, not shown, and the receptacles 33 in the chassis 26. It will thus be seen that the movement of the slide bracket 35 is limited in the rear by the stop flanges 22, as indicated by the dashed lines of FIG. 1, and in the front by the rear edges of the inturned top flanges 19.

From the description, the operation of the device may be readily understood. When a particular tray 14 in the assembly 10 is empty, the slide bracket 35 may rest in any position between its limits of movement within the middle wall sections 17. The chassis 26, with the desired electrical components, not shown, mounted in the receptacles 33, is inserted into a tray 14 through the corresponding frame opening 13. The sides of the chassis are received between the front wall sections 16. The chassis 26 is pushed toward the rear of the tray until the plug 34 makes contact with the socket 36, at which time the slide bracket 35 is pushed toward the rear of the tray by the continued movement of the chassis 26. When the slide bracket 35 engages the rear stops 22, the slide bracket 35 remains stationary while the chassis 25 continues to move rearward until the plug 34 completely engages the socket 36 and the front face 27 simultaneously abuts against the frame opening 13. Thus, the chassis 26 will be completely inserted into the tray 14, and the electronic components will be electrically connected to their source of power.

When it becomes necessary for the operator to inspect or make adjustments of the electronic components mounted on the chassis 26, the operator unlocks the chassis 26 by manipulating the device 29 and then partially withdraws the chassis from its tray 14 by pulling on the handle 28 to the position disclosed in FIG. 1. The forward motion of the chassis 26 will carry with it the slide bracket 35 without disengaging the plug 34 from the socket 36. The loop wires 25 are long and flexible enough to uncoil without withdrawing the socket 36 from the plug 34. Continued forward motion of the chassis 26 will cause the slide bracket 35 to stop against the rear edges of the top flanges 19 and the plug 34 to become disengaged from the socket 36. The chassis 26, after disengagement of the connectors 34 and 36, may be fully withdrawn from the tray assembly 10.

FIG. 3 discloses a modified tray assembly having a front panel $\mathbf{12^1}$ and a frame opening $\mathbf{13^1}$ for a single tray with laterally adjustable side walls $\mathbf{15^1}$ having bottom runners $\mathbf{11^1}$ and forward top flanges $\mathbf{19^1}$ and middle top flanges $\mathbf{20^1}$. The side walls $\mathbf{15^1}$ are adapted to be secured to the front frame openings $\mathbf{13^1}$ by means of a clamping screw bracket $\mathbf{37^1}$.

A plug-in chassis assembly made in accordance with this invention provides for complete concealment of all electronic components and their controls, not only to produce a neat and attractive appearance in cabinets and housings for electronic equipments but also to prevent observation of the operating parts by casual or unauthorized persons. The delayed electrical disconnection of the electronic components upon partial withdrawal of the chassis from the tray, provides ready accesibility to the controls and those components necessary to be inspected by the operator in order to insure adequate maintenance.

It will be apparent to those skilled in the art that various changes may be made in the invention, without departing from the spirit and scope thereof, and therefore the invention is not limited by that which is shown in the drawings and described in the specification, but only as indicated in the appended claims.

What is claimed is:

1. A plug-in chassis assembly comprising a tray having parallel longitudinal side guide walls, a front panel and an opening in said front panel substantially as wide as the distance between said side walls, a chassis for carrying electronic components, said chassis being adapted to be slidably received between said guide walls for longitudinal movement into and out of said tray through said opening, a front panel on said chassis, said front chassis panel being adapted to abut against said front tray panel, an electrical connector extending from the rear end of said chassis, electrical means for communicating said connector with said electronic components, a connector support member longitudinally slidable between said guide walls behind said chassis, a mating connector mounted on the front of said support member for electrically engaging said chassis connector, flexible means for electrically connecting said mating connector to a source of power, the height of said support member being slightly greater than the height of said chassis, a front stop extending inwardly from said guide wall above said chassis to permit the free longitudinal movement of said chassis therebeneath, said front stop being located in the path of said support member to limit the forward movement of said support member, and a rear stop spaced a predetermined distance behind said front stop to limit the rearward longitudinal movement of said support member.

2. The invention according to claim 1 in which each side guide wall comprises a front section, a middle section and a rear section, said front stop comprises a flange extending inwardly from each front wall section to slidably receive said chassis, a second set of flanges extending inwardly from said middle wall section to slidably receive the top of said support member, said rear stop comprising vertical flanges extending inwardly from said rear wall section adjacent said middle wall section.

3. The invention according to claim 1 in which a shield is mounted on said chassis behind said front chassis panel, and means are provided for mounting devices on said shield for controlling the electronic components mounted on said chassis, the longitudinal dimension of said shield being substantially equal to the limited travel of said connector support member between said front and rear stops.

References Cited in the file of this patent

UNITED STATES PATENTS

| | | |
|---|---|---|
| 1,791,123 | Costa | Feb. 3, 1931 |
| 2,486,764 | Singer | Nov. 1, 1949 |
| 2,602,842 | Morris | July 8, 1952 |
| 2,609,268 | Nye | Sept. 2, 1952 |
| 2,672,506 | Schulz | Mar. 16, 1954 |
| 2,789,024 | Heisler | Apr. 16, 1957 |
| 2,871,457 | Jencks | Jan. 27, 1959 |
| 2,898,585 | Bauman | Aug. 4, 1959 |